United States Patent [19]

Nobel et al.

[11] Patent Number: 4,565,610

[45] Date of Patent: Jan. 21, 1986

[54] BATH AND PROCESS FOR PLATING LEAD AND LEAD/TIN ALLOYS

[75] Inventors: Fred I. Nobel, Sands Point; Barnet Ostrow, Roslyn; David N. Schram, Freeport, all of N.Y.

[73] Assignee: LeaRonal, Inc., Freeport, N.Y.

[21] Appl. No.: 723,597

[22] Filed: Apr. 15, 1985

Related U.S. Application Data

[60] Division of Ser. No. 564,516, Dec. 22, 1983, which is a continuation-in-part of Ser. No. 301,390, Sep. 11, 1981, abandoned.

[51] Int. Cl.$^4$ .................. C25D 3/32; C25D 3/36; C25D 3/56; C25D 3/60
[52] U.S. Cl. .................. 204/44.4; 204/53; 204/54 R
[58] Field of Search .............. 204/44.4, 53, 54 R, 204/123, 114, 120

[56] References Cited

U.S. PATENT DOCUMENTS

| | | | |
|---|---|---|---|
| 2,525,942 | 10/1950 | Proell | 204/45 |
| 3,663,384 | 5/1972 | Lescure | 204/44.4 |
| 3,905,878 | 9/1975 | Dohi et al. | 204/45 |
| 4,000,047 | 12/1976 | Ostrow et al. | 204/43 S |
| 4,132,610 | 1/1979 | Dohi et al. | 204/44.4 |
| 4,384,930 | 5/1983 | Eckles | 204/43 |
| 4,388,158 | 6/1983 | Inui et al. | 204/27 |
| 4,459,185 | 7/1984 | Obata et al. | 204/43 S |

FOREIGN PATENT DOCUMENTS

| | | | |
|---|---|---|---|
| 122265 | 9/1976 | German Democratic Rep. | 204/44.4 |
| 555929 | 9/1943 | United Kingdom | 204/44.4 |

OTHER PUBLICATIONS

Dohi et al., "Bright Solder And Indium Plating From Methane Sulfonic Acid", Proceeding Of Electroplating Seminar, 7/78.

Dohi et al., "Electrodeposition Of Bright Tin-Lead Alloys From Alkanolsulfonate Baths", Proceedings Of Interfinish 80.

*Primary Examiner*—G. L. Kaplan
*Attorney, Agent, or Firm*—Pennie & Edmonds

[57] ABSTRACT

This invention relates to the electrodeposition of tin, lead and particularly tin-lead alloys from an electroplating bath comprising a lead and/or tin alkylsulfonate, an alkylsulfonic acid in a sufficient amount to impart a pH below about 3 to the bath, and various additives to improve the brightness of the deposits, the useful current density ranges, and/or the solderability of tin-lead alloy deposits including quaternary nitrogen wetting agents containing a fatty acid radical, alkylene oxides, pyridine compounds, aromatic aldehydes, acetaldehyde and/or a bismuth compound.

8 Claims, No Drawings

BATH AND PROCESS FOR PLATING LEAD AND LEAD/TIN ALLOYS

This application is a division of Ser. No. 564,516, filed Dec. 22, 1983, which is a continuation-in-part of Ser. No. 301,390, filed Sept. 11, 1981, abandoned

TECHNICAL FIELD

The invention relates to alkyl sulfonate electrolytic plating baths for plating tin and lead metals and particularly tin-lead alloys.

BACKGROUND OF THE INVENTION

The time-honored method for plating tin-lead alloys, commonly called Solder Plate, is to have these two metals present in solution as fluoborates with an excess of fluoboric acid and boric acid. In order to obtain smoother deposits, it is common to add various types of proteins, such as peptones, glue, gelatin or meat proteins. The fluoborate-based bath containing peptone is most commonly used and it is commercially successful in obtaining smooth matte deposits. Brighter tin-lead solder deposits can be obtained from these fluoborate-based baths by adding various brightening agents, such as aromatic aldehydes, pyridine compounds, ethylene oxide wetting agents and formaldehyde.

The main problem with these fluoborate-based baths is the fluoborate ion itself. Fluoborates are not only highly poisonous but are also highly corrosive to the equipment used in the plating environment. Fluoborates are also difficult to remove from the waste water that follows the plating operation and presents a serious problem for the waste-disposal engineer.

Alkane or alkyl sulfonic acids containing 1 to 5 carbon atoms in the alkyl group have previously been used in electrolytic plating baths. See, for example, U.S. Pat. No. 2,525,942 to Proell.

Alkanolsulfonates, phenolsulfonates and cresolsulfonates have also been used in electroplating baths. See, for example, the article entitled ELECTRODEPOSITION OF BRIGHT TIN-LEAD ALLOYS FROM ALKANOLSULFONATE BATH by N. Dohi and K. Obata, Proceedings of Interfinish 80, as well as U.S. Pat. Nos. 4,132,610 and 3,905,878. The alkanolsulfonates and the arylsulfonates are deficient in many respects.

SUMMARY OF THE INVENTION

This invention relates to the electrodeposition of tin, lead and particularly tin-lead alloys from an electroplating bath comprising a lead and or tin alkylsulfonate, an excess of alkylsulfonic acid sufficient to bring the pH of the bath below about 3 and advantageously to less than about 2, and various additives to improve the brightness of the deposits, the useful current density ranges, and/or the solderability of tin-lead alloy deposits including quaternary nitrogen wetting agents containing a fatty acid radical, alkylene oxides, pyridine compounds, aromatic aldehydes, acetaldehyde and/or a bismuth compound.

THE INVENTION IN DETAIL

The tin and lead compounds useable are those which are soluble in the alkyl sulfonic acid and which will form an alkyl sulfonic acid salt. The alkyl sulfonic acids and their tin and lead salts are known compounds and can be readily prepared by those skilled in the art and as disclosed in U.S. Pat. No. 2,525,942 as well as by the art cited therein.

The alkyl sulfonic acids useful according to the invention are those which are water soluble or soluble in the bath. The lower alkyl sulfonic acids containing 1-5 carbon atoms are thus most advantageous, particularly methane or methyl sulfonic acid.

The tin and/or lead metals can be added to the baths in various forms and do not have to be added as a soluble alkylsulfonate salt. Lead, for example, can be added as the acetate. Thus, the baths of this invention can contain ions other than sulfonate ions so long as sufficient sulfonate ions are present to produce the advantageous results of the invention. The metals should predominate as sulfonates in the baths.

The amount of the total metal salt when using methylsulfonic acid is advantageously less than about 8 percent by weight when the electrolyte is used at low current densities and high throwing power is desired. Increased amounts of the metal salts significantly decrease the throwing power of the solution particularly at low current densities. The most advantageous amounts are from about 4.5 to 2 percent of the metal salt or about 3 to 1 percent of the metal or metals as the sulfonic acid salt.

The invention includes improved tin and/or lead alkylsulfonic acid baths containing quaternary nitrogen-fatty acid based wetting agents to improve the high current density range and throwing power of the bath as well as the surface finish of the resulting deposit.

The preferred quaternary nitrogen-fatty acid based wetting agents are amphoteric and are the water or solution soluble imidazoline, monoazoline and/or amidobetaine compounds. These types of wetting agents are well known in the art and are commercially available from Lonza Inc. under the tradename AMPHOTERGE by Miranol Chemical Company, Inc. under the tradenames MIRANOL and MIRATAINE and by Mona Industries, Inc. under the tradename MONATERICS. Other manufacturers of these materials are also available. The most preferred compounds are the imidazolines having the formula:

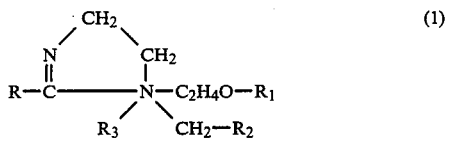

(1)

in which R is a fatty acid radical; $R_1$ is H, Na or $CH_2COOM$; $R_2$ is $COOM$, $CH_2COOM$ or $CHOHCH_2SO_3M$; M is Na, H or an organic base; and $R_3$ is OH, an acid salt or the salt of an anionic surface active sulfate or sulfonate.

The most advantageous compounds are those in which R contains 6 carbon atoms or more, $R_1$ is $CH_2COOM$, $R_2$ is $COOM$ and $R_3$ is OH. Best results to date have been obtained from the compound where R is $C_7H_{15}$ (capric), $R_1$ is $CH_2COONa$, $R_2$ is $COONa$ and $R_3$ is OH (AMPHOTERGE KJ-2).

Carboxylic or sulfonic acid-fatty acid wetting agents containing tertiary nitrogen, such as the compound of formula (5), can also be used and the quaternary formed in situ by the acid contained in the bath. This same compound where R is $C_{12}H_{20}$ (coconut oil), also gives excellent results. Oleic hydroxyethyl alkyl imidazole and N' cocoyl-N-N' dimethyl glycine are other specific examples of imidazoline wetting agents.

Other compounds found to be useful according to the invention include:

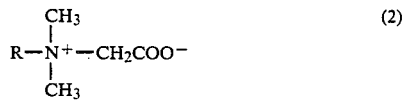

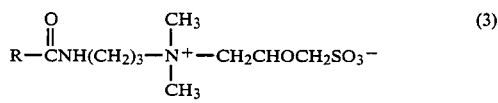

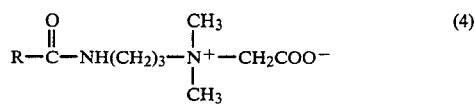

and

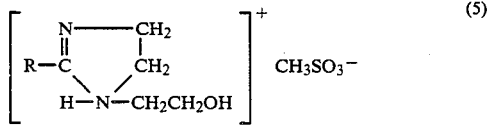

where R has the same meaning as assigned above with respect to formula (1). The chain lengths of the various alkyl radicals and group can also be varied so long as water or solution solubility is maintained and the compounds retain wetting agent properties.

The compounds of formulas (3) and (4) are, at present, secondary interest. Examples of some specific compounds of formulas (3) and (4) include dimethyl [3 cocoamidopropyl] ammonioethanoate and cocoamidopropyl dimethyl ammonia-2-hydroxy-propane sulfonate. They produce improved finishes and throwing power but not as well as the compounds of formulas (1) and (2). Compounds according to formulas (1) and (2) produce solder deposits of a smooth matte finish equal in every way to those obtained from the peptone containing fluoborate based baths that are commonly used in industry today.

R has been designated in the above formulas as being a fatty acid radical. The fatty group can be saturated or unsaturated. The only upper limit on the number of carbon atoms would be the solubility of the compound in the bath solution and this may vary depending on the compound being used. For example, the compound of formula (2) can contain more carbon atoms in the fatty group than that of formula (1) and still retain water solubility. The particular anion in the above formulas is not critical but sodium is preferred. Mixtures of the wetting agents can also be used.

The amphoteric wetting agents useful according to this invention are broadly defined as quaternary nitrogen wetting agents containing an acid group derived from a fatty acid and one or more solubilizing groups. The solubilizing group can be a carboxylic or sulfonic acid group, alkanol group, etc.

The amount of these wetting agents is not critical and optimum amounts will vary depending on the particular agent selected for use and the particular bath in which it is used. A sufficient amount of the wetting agent should be used to obtain the results desired. Generally, 1 to 2 ml/l of the wetting agents give excellent results with pure tin and 60/40 tin-lead alloy baths. Higher amounts could be used but there is no particular reason to do so. As the lead content of the bath is increased, additional amounts of these wetting agents may have to be employed. Pure lead baths may require as much as 40 ml/l or more of these wetting agents to obtain improved surface characteristics and improved throwing power.

The addition of the quaternary nitrogen wetting agents markedly improved the coverage at low current densities (5–20 ASF) and the baths are thus particularly advantageous in rack plating, such as circuit boards, where low current densities are employed and high throwing power is required. With the more advantageous wetting agents, coverage can be obtained at current densities at even 1 or 2 ASF.

Alkylene oxide compounds have been used in fluoborate tin and tin-lead plating baths for many years and a typical example of a patent disclosing the use of these compounds is U.S. Pat. No. 4,000,047. In this patent as well as in other prior art, the alkylene oxide compounds were always considered substantially equivalent to each other. It has been found, however, that many of the alkylene oxide compounds cannot be used commercially in alkane sulfonic acid based plating baths. Those alkylene oxide compounds having a cloud point below about 90° F. cause reduced cathode efficiency and the deposits exhibit poor solderability when compared to baths containing an alkylene oxide compound whose cloud point is above about 90° F. Some alkylene oxide compounds, when used in the alkane sulfonic acid based baths, will be clear when the alkylene oxide is added, but after about a day's use, will become cloudy. The plating bath can then be expected to lose cathode efficiency and produce a deposit with reduced solderability characteristics. As noted above, it is the cloud point of the alkylene oxide in the particular electrolytic solution being used that is important rather than the cloud point of the alkylene oxide in water alone, since the environmental condition of the bath can change the cloud point. The addition of an imidazoline compound will, for example, raise the cloud point of the alkylene oxide surface active agents. Thus, in such instances, alkylene oxide compounds having a cloud point below about 90° F. in water alone can be used in such electrolytic solutions so long as the cloud point is not so low that it cannot be raised to the desired level by the addition of other materials such as the imidazolines. Those alkylene oxide compounds disclosed in U.S. Pat. No. 4,000,047 having the appropriate cloud point can be used according to this invention.

These alkylene oxide containing baths can be used to produce smooth matte deposits in the low current density range (5–20 ASF) and, after fusing, the deposit surfaces are smooth, finer grained, bright and showed good solderability. In the high current density range the deposits are dark with 30 to 50% of the area burnt. The use of the proper alkylene oxide compounds also improves the plating range over which useful deposits can be obtained.

The use of the quaternary nitrogen-fatty acid compounds, particularly the imidazolines, used in combination with the alkylene oxide compounds, gives further improvements than would be expected, i.e., they act synergistically.

The pyridine or quinoline compounds useful according to this invention are those described in U.S. Pat. No. 4,000,047. The pyridine compounds are preferred. The amounts of pyridine or quinoline compounds incorporated into the electrolytes of this invention can be the same as disclosed in U.S. Pat. No. 4,000,047.

The aromatic aldehydes, as well as the amounts, useful according to this invention are also those described in U.S. Pat. No. 4,000,047.

U.S. Pat. No. 4,000,047 is incorporated herein by reference, particularly with regard to its disclosure of pyridines, quinolines, aromatic aldehydes and alkylene oxide compounds which can be used in accordance with this invention.

Bismuth compounds are used in this invention in order to improve the low current density brightness of the deposits.

The bismuth compounds useful in this invention are those which are water or solution soluble and the anion produced by the bismuth compound should not interfere with the tin or lead salts, such as causing precipitation thereof. Bismuth nitrate is an example of an acceptable bismuth compound. The amount of bismuth should be sufficient to obtain the desired low current density range. As little as 0.1 g/l of bismuth metal as bismuth nitrate can lower the useful current density range to close to zero ASF rendering the baths very useful for barrel plating. Bismuth alone does not give the brightness at low current densities. The brightness is obtained only in combination with an aromatic aldehyde and/or an alkylene oxide.

Acetaldehyde is used in this invention to increase the high current density of the plating bath. The degree of increase is unexpected and dramatic. The amount of acetaldehyde should be sufficient to raise the useful current density range to that desired. 1 m/l has been found sufficient to raise the current density range from a high of 40 ASF to 200 ASF.

The particular combination of additives employed with the basic electrolyte will depend on the results or types of deposits desired. Matte deposits with good solderability can be obtained using an alkylene oxide of the appropriate cloud point and an imidazoline or quaternary compound. Bright deposits can be obtained by adding ethylene oxide and an aromatic aldehyde. The useful current density can be extended to the high range (20 to 200 ASF) by the addition of acetaldehyde and to the low range of slightly above zero to about 40 by the addition of a bismuth compound.

The plating bath can be prepared by placing tin and/or lead sulfonic acid salt in an excess of the alkyl sulfonic acid, adjusting the acid content to the required pH, removing any undissolved matter by filtration, and then diluted with water to the final desired volume. The plating bath is generally operated at ambient temperatures. Agitation is desirable for increased plating speed.

Various alloys can be produced depending on the tin-lead metal ratios employed on the plating solutions. For plating a 60:40 tin-lead alloy, for example, 20 g/l of tin metal and 10 g/l of lead metal can be used. With such a bath, alkylsulfonic acid is advantageously present at about 150 g/l of 100 percent alkylsulfonic acid.

The addition of a small amount of a reducing agent to the baths will assist in keeping the tin in the soluble divalent state, since tetravalent tin is insoluble in the bath. About 0.5 g/l of resorcinol is generally sufficient to accomplish this purpose.

EXAMPLE 1

2 ml/l of capric dicarboxy imidazoline, a product of Lonza Inc. marketed under the trademark AMPHOTERGE KJ-2, was added to the following bath:

| | |
|---|---|
| Tin metal (as the methane sulfonate) | 18 g/l |
| Lead metal (as the methyl sulfonate) | 9 g/l |
| Methyl sulfonic acid (100% basis) | 70 ml/l |

Plating was accomplished at ambient temperature and at 5 to 15 ASF. The resulting 60:40 tin/lead alloy deposit is white matte and the low current density coverage is markedly improved as compared to the bath run under the same conditions without the imidazoline. The deposit obtained without the imidazoline was a dark grey matte.

EXAMPLE 2

2 ml/l of AMPHOTERGE KJ-2 and 2 ml/l of a coco betaine according to formula (2) where R is the coco alkyl radical and marketed by the Mirnol Chemical Co., Inc. under the trademark MIRATAINE CDMB is added to the following bath:

| | |
|---|---|
| Tin metal (as the methane sulfonate) | 20 g/l |
| Methane sulfonic acid (100% basis) | 70 ml/l |
| Ambient temperature | |
| Current density | 5-15 ASF |

The pure tin deposit has a white matte appearance and the low current density coverage is markedly improved as compared to the bath run without the imidazolines. The deposit obtained without the imidazoline has a dark grey matte appearance.

EXAMPLE 3

4 ml/l of a coconut imidazoline amphoteric surfactant manufactured by Mona Industries, Inc. under the tradename MONATERIC CA was added to the following bath:

| | |
|---|---|
| Tin Metal (as methyl sulfonic acid) | 90 g/l |
| Methyl sulfonic acid (100% basis) | 150 ml/l |
| Ambient temperature | |
| Current density | 10-25 ASF |

A white matte deposit and the low current density coverage is considerably improved as compared to the same bath run under the same conditions without the imidazoline. The deposit without the imidazoline had a dark grey matte appearance.

EXAMPLE 4

40 ml/l of 1-hydroxyethyl-2-oleicimidazoline is added to the following plating bath:

| | |
|---|---|
| Lead metal (as acetate) | 15 g/l |
| Methyl sulfonic acid (100% basis) | 50 ml/l |
| Ambient temperature | |
| Current density | 5-15 ASF |

The resulting pure lead deposit has a white matte appearance and the low current density coverage is considerably improved as compared to the bath run under the same conditions without the imidazoline. The deposit without the imidazoline has a dark grey matte appearance.

EXAMPLE 5

| | |
|---|---|
| Tin metal (as methane sulfonic acid) | 20 g/l |
| Lead metal (as methane sulfonic acid) | 2 g/l |
| Methane sulfonic acid (100% basis) | 70 ml/l |
| AMPHOTERGE KJ-2 (by Lonza) | 1 ml/l |
| Ambient temperature | |
| Current density | 2-30 ASF |

The deposits produced are white matte and analyze 90% tin, 10% lead. Other alloys are possible by adjusting the ratios of tin and lead in the plating bath.

It is also possible to add a conducting salt if needed to improve solution conductivity or throwing power. The alkali salt of the methyl sulfonic acid adjusted to the pH of the bath can, for example, be used.

EXAMPLE 6

| | |
|---|---|
| Tin metal (as methyl sulfonic acid) | 15 g/l |
| Lead metal (as methyl sulfonic acid) | 2 g/l |
| Sodium salt of methyl sulfonic acid | 75 g/l |
| AMPHOTERGE KJ-2 (by Lonza) | 1½ ml/l |
| pH (adjusted with methyl sulfonic acid) | 2.0 |
| Ambient temperature | |
| Current density | 20-40 ASF |

The above bath produces a white matte deposit.

The following Examples employed the following basic electrolyte bath:

| | |
|---|---|
| Tin as stannous methane sulfonate | 18 g/l |
| Lead as lead methane sulfonate | 9 g/l |
| Methane sulfonic acid | 150 g/l |

Hull Cell panels are run for 5 minutes at 1 amp. total current in all of the following Examples:

EXAMPLE 7

10 g/l polyoxyethylene lauryl ether (23 moles ethylene oxide condensate) (Brij-35-Atlas) was added to the basic electrolyte.

The bath produces a Hull Cell panel that is smooth and matte in the low current density range with about 30 to 50% burn in the high current density areas. After fusing, the deposit surface is very smooth, bright and leveled showing good solderability.

EXAMPLE 8

To Example 7, 1 g/l capric dicarboxyimidazoline amphoteric surfactant (AMPHOTERGE KJ-2-Lonza) is added. This bath provides an increased high current density range with no evidence of burning or darkening of the deposit. After fusing, the deposit is very smooth, bright and leveled showing good solderability.

EXAMPLE 9

10 g/l nonyl phenol/12 ethylene oxide condensate are added to the basic electrolyte. The bath provides a smooth deposit with only 50% of the high current density range dark and burnt.

EXAMPLE 10

To Example 9, 0.18 g/l of a picolinic acid, 0.1 g/l of allylether of orthoxyhydroxybenzaldehyde and 0.16 ml/l orthochlorobenzaldehyde are added.

The deposits from this bath exhibit a bright current density range from 15 to 40 ASF. The low current density range is hazy to dull and the high current density range dull burnt.

EXAMPLE 11

To Example 10, 1 ml/l acetaldehyde was added. The deposit is brilliant at current density ranging from 20 to 200 ASF. This example shows the power of acetaldehyde in the alkyl sulfonic acid electrolytes containing the brighteners of Example 10 to drastically raise the useful current density range.

EXAMPLE 12

To Example 10, 0.1 g/l bismuth metal as bismuth nitrate is added. The bath provides a deposit with brilliance at current density ranging from near 0 to 40 ASF.

This example shows the power of bismuth in the alkyl sulfonic acid electrolyte containing the brighteners of Example 10 to drastically reduce the useful current density range to very low values.

EXAMPLE 13 (Comparative)

0.1 g/l bismuth metal as bismuth nitrate is added to the bath of Example 7 and there is no improvement in the low current density areas. This shows the low current density improvement and synergism provided by the use of bismuth in combination with the aromatic aldehydes and brighteners listed in U.S. Pat. No. 4,000,047.

EXAMPLE 14

Example 11 is repeated but in this case the picolinic acid was left out. The deposit is brilliant with the bright current density ranging from 40-200 ASF. This example shows that it is possible to eliminate the pyridine type materials of U.S. Pat. No. 4,000,047 and still get good results in the higher current density ranges. There is some loss in the low current density range—from a lower limit of 20 ASF in Example 11 to 40 ASF in this example—but this loss is not significant in those applications where only the high current density range is needed.

In all of the above Examples, the electrolytic solutions were diluted with water to form the desired volume.

We claim:

1. An electroplating bath for the electrodeposition of lead and lead-tin alloys comprising an aqueous solution containing the metal or metals as a lower alkylsulfonate salt, a soluble alkylsulfonic acid in a sufficient amount to give a pH below about 3 to the bath, an aromatic aldehyde and a soluble bismuth compound in a sufficient amount to extend current density range for producing bright deposits.

2. The bath of claim 1 containing acetaldehyde in a sufficient amount to extend the useful current density range.

3. An electroplating bath for the electrodeposition of lead-tin alloys comprising an aqueous solution containing lead and tin as soluble alkyl-sulfonates, a sufficient amount of a soluble alkylsulfonic acid salt to impart a pH value below about 3 to said bath, and an aromatic aldehyde and a soluble bismuth compound in a sufficient amount to extend current density range for producing bright deposits.

4. The bath of claim 3 containing acetaldehyde in a sufficient amount to extend the useful current density range.

5. A method for electroplating lead-tin alloys wnhich comprises immersing a substrate to be plated into the electroplating bath of claim 4.

6. A method for electroplating lead-tin alloys which comprises immersing a substrate to be plated into the electroplating bath of claim 3.

7. A method for electroplating lead and lead-tin alloys which comprises immersing a substrate to be plated into an electroplating bath comprising an aqueous solution containing lead and tin as soluble alkyl-sulfonates, a sufficient amount of a soluble alkylsulfonic acid salt to impart a pH value below about 3 to said bath, and an aromatic aldehyde and a soluble bismuth compound in a sufficient amount to extend current density range for producing bright deposits.

8. The method of claim 7 wherein the electroplating bath further comprises acetaldehyde in a sufficient amount to extend the useful current density range.

* * * * *

UNITED STATES PATENT AND TRADEMARK OFFICE
CERTIFICATE OF CORRECTION

PATENT NO.   : 4,565,610
DATED        : January 21, 1986
INVENTOR(S)  : Fred I. Nobel, Barnet Ostrow and David Schram It is certified that error appears in the above-identified patent and that said Letters Patent is hereby corrected as shown below:

Column 9, line 4, "wnhich" should be --which--

Signed and Sealed this

Sixth Day of May 1986

[SEAL]

Attest:

DONALD J. QUIGG

Attesting Officer

Commissioner of Patents and Trademarks